United States Patent
Lee et al.

(10) Patent No.: US 8,160,192 B2
(45) Date of Patent: Apr. 17, 2012

(54) SIGNAL INTERLEAVING FOR SERIAL CLOCK AND DATA RECOVERY

(75) Inventors: Dongyun Lee, San Jose, CA (US); Sungjoon Kim, Cupertino, CA (US)

(73) Assignee: Silicon Image, Inc., Sunnyvale, CA (US)

( * ) Notice: Subject to any disclaimer, the term of this patent is extended or adjusted under 35 U.S.C. 154(b) by 986 days.

(21) Appl. No.: 11/861,175

(22) Filed: Sep. 25, 2007

(65) Prior Publication Data

US 2008/0075222 A1   Mar. 27, 2008

Related U.S. Application Data

(60) Provisional application No. 60/847,342, filed on Sep. 25, 2006.

(51) Int. Cl.
*H04L 7/00* (2006.01)
(52) U.S. Cl. ........ 375/354; 375/326; 375/373; 375/376; 375/215; 375/252; 375/294
(58) Field of Classification Search .................. 375/354, 375/326, 373, 376, 215, 294
See application file for complete search history.

(56) References Cited

U.S. PATENT DOCUMENTS

| | | | |
|---|---|---|---|
| 6,100,735 | A | 8/2000 | Lu |
| 6,861,886 | B1 | 3/2005 | Ludden et al. |
| 7,034,597 | B1 | 4/2006 | Mo et al. |
| 7,279,944 | B2 * | 10/2007 | Lu ................................ 327/152 |
| 2003/0099321 | A1 | 5/2003 | Juan et al. |
| 2005/0111602 | A1 * | 5/2005 | Suda et al. .................. 375/355 |
| 2006/0097767 | A1 | 5/2006 | Lu |
| 2006/0140318 | A1 * | 6/2006 | Farjad-rad ................... 375/355 |
| 2007/0230646 | A1 * | 10/2007 | Talbot et al. ................. 375/355 |

FOREIGN PATENT DOCUMENTS

TW   1256539   6/2006

OTHER PUBLICATIONS

Extended European Search Report for European Patent Application No. 07253794.7, Mailed Jul. 1, 2011, 7 pages.
Sawyer, Nick, "Data Recovery", Xilinx, Inc., Jul. 11, 2005, 7 pages.
Notice of First Action for Chinese Patent Application No. 200710159690.5, Mailed Sep. 9, 2011, 16 pages.

* cited by examiner

*Primary Examiner* — Kabir A Timory
(74) *Attorney, Agent, or Firm* — Blakely Sokoloff Taylor Zafman LLP

(57) ABSTRACT

A clock and data recovery (CDR) system and method for recovering timing information and data from a serial data stream. The CDR system includes a sampling circuit that produces a recovered clock/data signal and an interleaving feedback network that provides feedback to the sampling circuit. The feedback network includes a logic circuit that produces control signals based on the recovered clock/data signal, a first multiplexer that selects from four phases of a global clock signal based on a control signal, a first delay-locked loop having a first set of delay cells coupled to a second multiplexer that produces a delayed signal based on the selected global clock signal, and a second delay-locked loop having a second set of delay cells that produces a set of phase-shifted feedback signals that are applied to the sampling circuit to phase-align the sampling circuit with the transitions in the received serial data stream.

21 Claims, 3 Drawing Sheets

SIGNAL INTERLEAVING FOR SERIAL CLOCK AND DATA RECOVERY

CROSS-REFERENCE TO RELATED APPLICATIONS

The present application claims priority to U.S. Provisional Patent Application No. 60/847,342 entitled "SHIFTED DLL CLOCK DATA RECOVERY," and filed on Sep. 25, 2006, which is hereby incorporated by reference.

TECHNICAL FIELD

The present disclosure is directed to a system and method for recovering clock and data from a serial data stream.

BACKGROUND

Modern processing systems often rely on serial data transfer techniques to exchange data with other system components. For example, many personal computers use a USB port for communicating with peripheral devices. Although intuitively it would appear that serial data transfer is slower than parallel data transfer, serial transfer efficiency surpasses parallel transfer efficiency at higher data transfer rates. As data transfer rates increase, parallel transfer becomes more sensitive to small capacitances, mutual inductances, inter-symbol interference (ISI), and noise, all of which can reduce transfer speed and cause data distortion.

One drawback to serial data transfer, however, is that a processing system does not separately receive timing information with a data stream. Instead, the timing information is embedded within the data stream. When the processing system receives serial data, it needs to generate a clock signal from an approximate frequency reference and align the clock signal with the transitions in the received data stream. Unfortunately, as data transfer rates continue to increase, it becomes more and more difficult for a processing system to generate and align a clock signal, primarily because timing information must be captured and processed very quickly. Consequently, processing systems must include increasingly complex and thus expensive circuitry to accurately generate a clock signal to enable receipt of a serial data stream.

DETAILED DESCRIPTION

A clock and data recovery (CDR) system and method for recovering timing information and data from a serial data stream is disclosed. The CDR system includes a sampling circuit that produces a recovered clock/data signal and an interleaving feedback network that provides feedback to the sampling circuit. The feedback network includes a logic circuit that produces control signals based on the recovered clock/data signal, a first multiplexer that selects from four phases of a global clock signal based on a control signal, a first delay-locked loop having a first set of delay cells coupled to a second multiplexer that produces a delayed signal based on the selected global clock signal, and a second delay-locked loop having a second set of delay cells that produces a set of phase-shifted feedback signals that are applied to the sampling circuit to phase-align the sampling circuit with the transitions in the received serial data stream. The second delay-locked loop may be operated in an open mode during normal operation, and in a closed mode during transitions in timing or interleaving. In some embodiments, the logic circuit operates the first and second multiplexers to produce feedback signals having an incremental resolution that is based on the number N and period $T_1$ of the global clock signals and the number M of delay cells in the first delay-locked loop.

The CDR system may be implemented using any of a wide variety of electronic constructs, including integrated microelectronics, programmable devices, and circuits that are distributed across one or more electronic components. For example, embodiments can be incorporated into an integrated circuit, a programmable chip, a computer software program, and/or a printed circuit board having an interconnected chipset. Therefore, well known characteristics often associated with specific types of electronic media and circuits have not been shown or described in detail to avoid unnecessarily obscuring the description of the various embodiments. Those of ordinary skill in the relevant art will understand that additional embodiments may be practiced without several of the details described below, and that other embodiments may include aspects in addition to those described below with reference to FIGS. 1-3.

Figure 1:
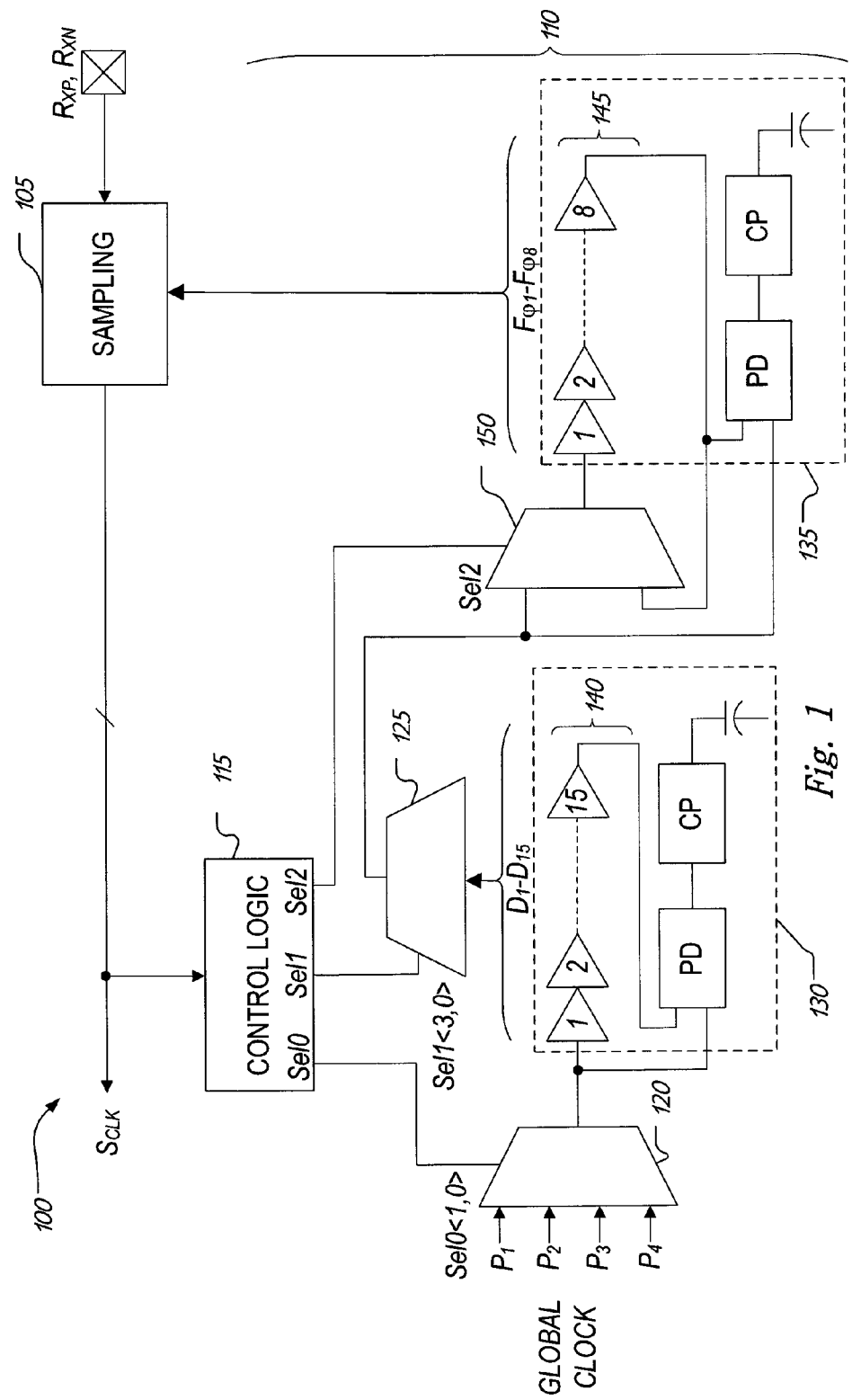
FIG. 1 is a schematic diagram of a clock and data recovery (CDR) system for recovering timing information and data from a serial data stream.

FIG. 1 is a block diagram of a representative clock and data (CDR) recovery system 100 that receives a serial data stream $R_{XP}$, $R_{XN}$ and produces a single- or multi-phase recovered clock signal $S_{CLK}$. The recovered clock signal may be used for decoding of data within the received serial data or for other system timing purposes. In the example shown in FIG. 1, the system 100 includes a sampling circuit 105 and an interleaving feedback network 110. The sampling circuit 105 samples the received serial data stream in accordance with feedback signals $F\phi_1$-$F\phi_8$ generated by the feedback network 110. As will be described herein, the feedback signals enable the sampler to quickly and accurately phase-align to transitions in the received serial data stream. In some embodiments, the sampling circuit 105 can include an array of individual samplers that are coupled to receive one or more of the feedback signals $F\phi_1$-$F\phi_8$ from the feedback network 110. The individual samplers can include, for example, a filter block, a sample and hold circuit, and control circuitry. The individual samplers sample the serial data $R_{XP}$, $R_{XN}$ based on the feedback signals and produce discrete signals corresponding to one or more clock signal phases.

To produce the feedback signals $F\phi_1$-$F\phi_8$, the feedback network 110 includes a control logic circuit 115; first and second multiplexers 120, 125; and first and second delay-locked loops (DLLS) 130, 135 having corresponding phase detectors (PD), charge pumps (CP), delay chains 140 and 145, and capacitors. Each of the delay chains in the DLLs is comprised of a series of delay cells that are connected back-to-back. The control logic circuit 115 generates several control signals (sel0, sel1, sel2) based on the sampled serial data. The control signals are used to coordinate the operation of the feedback network 110 as follows.

The first control signal sel0 is applied to the first multiplexer 120 and used to select one phase ($P_1$, $P_2$, $P_3$, $P_4$) of a four phase global clock that is to be interleaved. The four phase global clock is provided by a PLL or other timing circuit (not shown). The phase of the global clock that is selected by the control signal sel0 is applied to the input of the first DLL 130 and to the delay chain 140 within the DLL. The delay chain 140 produces a plurality of delayed signals $D_1$-$D_M$ (where $M=2^n-1$ for positive integer values of n). In some embodiments, n=4, thereby providing fifteen increments of clock signal delay, each corresponding to 24° of phase delay. The second multiplexer 125 is connected to each delay cell of the delay chain 140 in the first DLL 130. The control signal sel1 is applied to the second multiplexer 125 to select the desired delay cell from which a delayed signal $D_1$-$D_M$ is to be tapped. The selection of a particular global clock signal and a particular delay cell signal by the control logic 115 is referred to as interleaving the signals.

The delayed signal output from the second multiplexer 125 (i.e., one of the signals $D_1$-$D_M$) is coupled to the input of the second DLL 135. The second DLL may operate in two modes of operation. In an "open" mode of operation, a transition multiplexer 150 in the second DLL 135 is configured to receive the delayed signal output from multiplexer 125 and apply the delayed signal to the input of the DLL and to the delay chain 145 within the DLL. In a "closed" mode of operation, the transition multiplexer 150 is configured to receive the output of the delay chain 145 and apply the output of the delay chain to the input of the DLL. As will be discussed in further detail with respect to FIG. 3, the closed mode of operation is temporarily enabled when changing the interleaving (i.e., when changing either the selection of the clock via multiplexer 120 or the selection of the delay cell via multiplexer 125). The selected mode of operation for the second DLL is determined by control signal sel2 that is applied by the control logic 115 to the transition multiplexer 150. The second DLL 135 produces feedback signals $F\phi_1$-$F\phi_8$ corresponding to a specific unit interval (UI) of the serial data $R_{XP}$, $R_{XN}$. The feedback signals are tapped from each delay cell of the delay chain 145 in the second DLL 135, and are applied to the sampling circuit 105. In some embodiments, the number of stages in the delay chain 145 is eight, thereby producing eight feedback signals each separated in phase by 40° that may be used by the sampling circuit.

Those skilled in the art will appreciate that in some embodiments the second DLL 135 may be omitted, or the system 100 may use one or more other types of intermediary circuits for producing the feedback signals $F\phi_1$-$F\phi_8$ (e.g., a filter, a delay network, a PLL, etc.). Those skilled in the art will further appreciate that the control logic 115 generally comprises any of a wide variety of arrangements of registers, flip-flops, or other timing components for monitoring the recovered clock signal $S_{CLK}$ and coordinating at least a portion of the input and output signaling of the first and second DLLs 130, 135.

Figure 2:
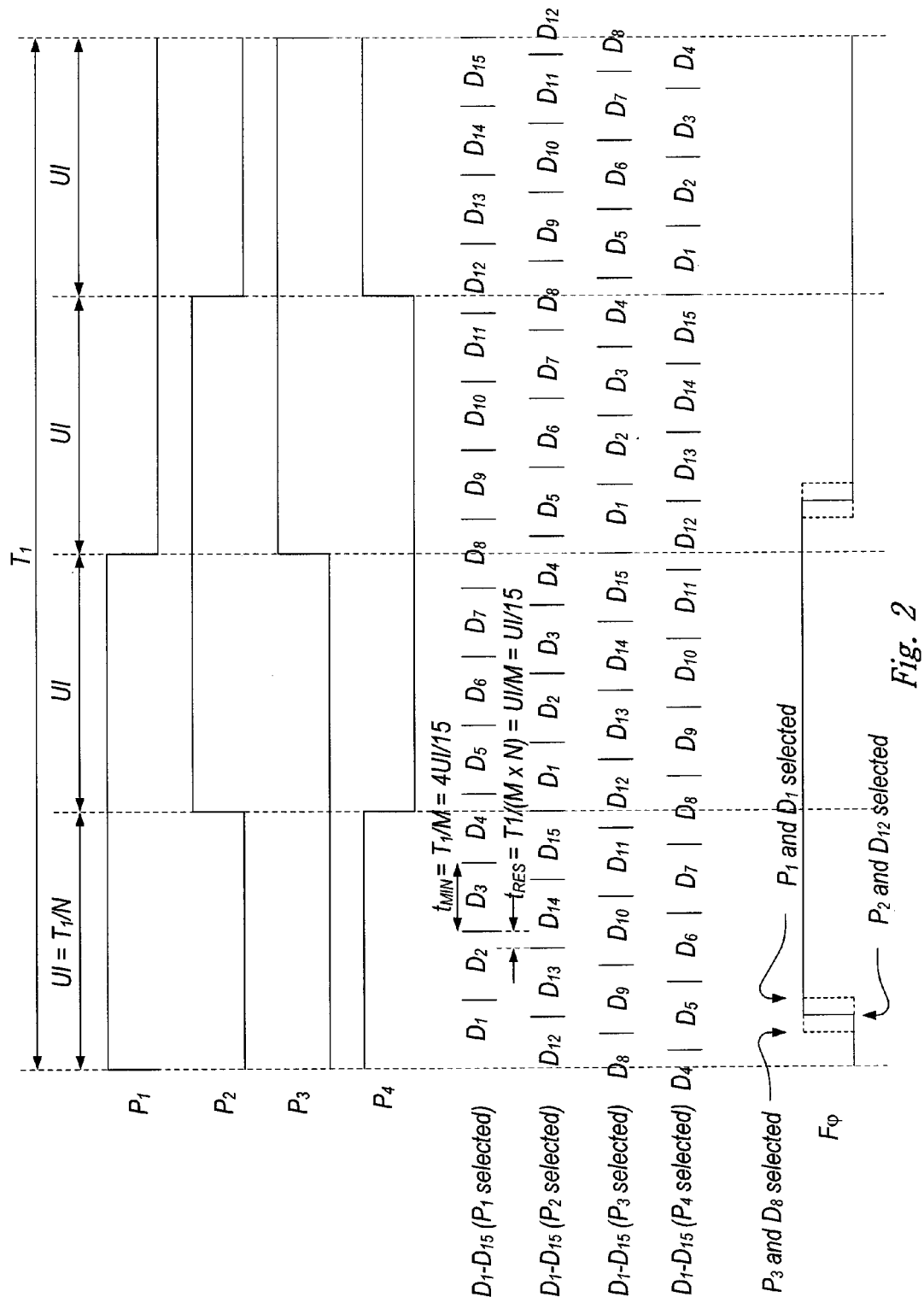
FIG. 2 is a timing diagram corresponding to a method of operating the CDR system of FIG. 1.

FIG. 2 is a timing diagram illustrating an embodiment of signal interleaving that can be carried out by the feedback network 110. More specifically, FIG. 2 shows the global clock signals $P_1$-$P_4$, the rising edges of the delayed signals $D_1$-$D_{15}$ (where M=15), and one of the feedback signals $F\phi$. The global clock signals $P_1$-$P_4$ have a period $T_1$ and are offset from each other by a phase difference of UI, which is equal to $T_1/4$. The delayed signals $D_1$-$D_{15}$ are offset from each other by a minimum delay time $t_{MIN}$ of $T_1/M$, which in the depicted embodiment is equal to 4 UI/15 or 24° of phase difference. The feedback signal $F\phi$ shown in a solid line corresponds to the feedback network 110 selecting global clock signal $P_2$ (via the first multiplexer 120) and the delayed signal $D_{12}$ (via the second multiplexer 125). In general, the feedback signal has a resolution $t_{RES}$ equal to $T_1/(M \times N)$ or UI/M. Thus, in the depicted embodiment, the feedback network 110 can move the feedback signal $F\phi$ forward or backwards in integer multiples of UI/15, i.e., in phase increments of about 6° over the period $T_1$. For example, the phase of the feedback signal $F\phi$ shifts forward when the first multiplexer 120 selects $P_1$ and the second multiplexer 125 selects $D_1$. Alternatively, the phase of the feedback signal $F\phi$ shifts backwards when the first multiplexer 120 selects $P_3$ and the second multiplexer 125 selects $D_8$. The forward and backward shifting of the feedback signal $F\phi$ is reflected by the dotted lines on the feedback signal in FIG. 2. The feedback network therefore provides a high degree of resolution when attempting to phase-align with the received serial data stream.

Figure 3:
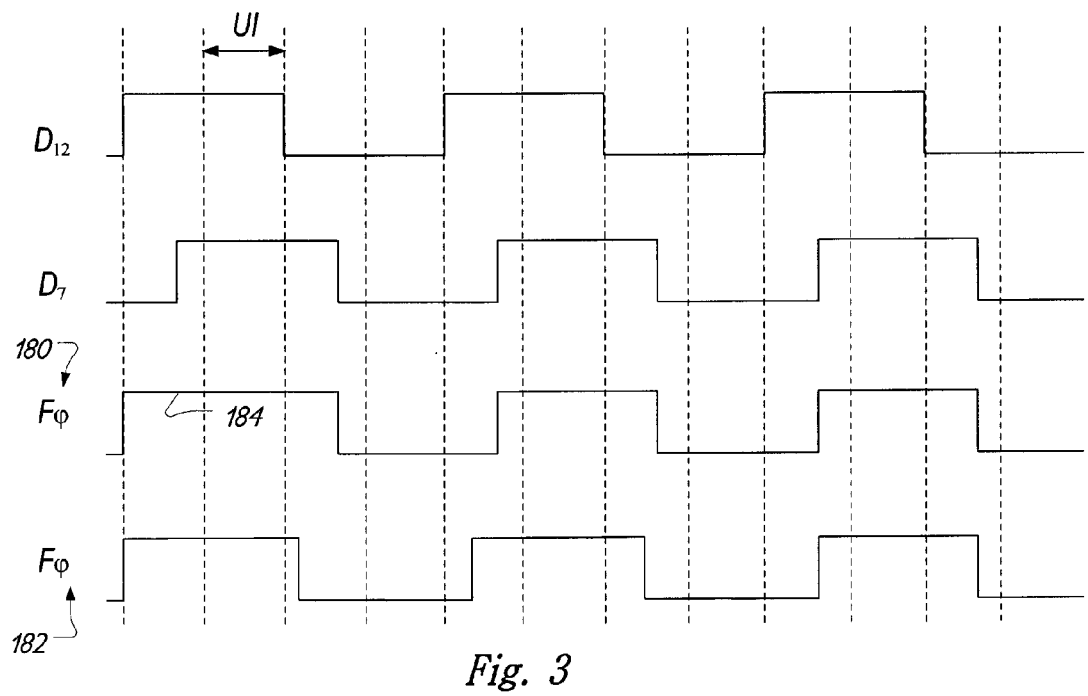
FIG. 3 is a timing diagram corresponding to a method for regulating signal transitions within a feedback network of the CDR system.

In operation, various instabilities may arise when changing the interleaving, either by switching the selection of the clock (via multiplexer 120) or by changing the selection of the delay cell (via multiplexer 125). Such a change in interleaving may arise when the feedback signals need to be changed in response to changes in the received data stream. FIG. 3 is a timing diagram reflecting one of the instabilities that may arise. FIG. 3 depicts timing diagrams for delayed signals $D_{12}$ and $D_7$, and two feedback signals that may be generated as a result of switching from $D_{12}$ to $D_7$. The first feedback signal $F\phi$ 180 is the result of an unregulated transition from $D_{12}$ to $D_7$. The feedback signal 180 has a stretched portion 184 that is caused by a lack of regulation between the transition from $D_{12}$ and $D_7$. (In other unregulated transitions, the feedback signal may have a shortened portion rather than a stretched portion.) In contrast, the second feedback signal $F\phi$ 182 is the result of a regulated transition from $D_{12}$ to $D_7$, whereby the regulation gradually shifts the necessary change in the feedback signal across two or more UIs. The signal regulation, for example, can be carried out by the transition multiplexer 150 of the second DLL 135 (FIG. 1). By switching the transition multiplexer 150 so that the DLL operates in the closed mode of operation for one or two cycles, the multiplexer can temporarily delay the application of the delayed signal $D_7$ directly to the delay chain 145. This isolates the delayed signal $D_{12}$ currently in the delay chain 145, allowing the phase detector PD in the second DLL 135 to gradually adjust the phase of the signals until the DLL can be switched to the open mode of operation and the delayed signal $D_7$ applied directly to the delay chain 145. As shown in FIG. 3, the second feedback signal $F\phi$ 182 transitions within less than two cycles. In other embodiments, signal regulation may be carried out in other ways. For example, the feedback network 110 could include a third DLL to gradually shift the rate at which the delayed signals $D_1$-$D_M$ transition.

In contrast to the disclosed CDR system 100, conventional feedback networks have difficulty achieving high resolution values at fast serial data transfer rates. In particular, in the 0.13 um feature size regime and beyond, the resolution of conventional feedback networks is generally constrained by the delay elements within a feedback device (i.e., a DLL, a PLL, or other type of looping device). For example, at data rates of 5 Gbps or higher (i.e., UI≧200 ps) and having a resolution of UI/15 (see, e.g., FIG. 2), a conventional DLL-based feedback device requires 60 delay cells coupled together in series. Each delay cell within the series needs to have a minimum delay time $t_{MIN}$ of about 13 ps. The requirements of short delay times as these, in addition to the large number of delay cells, significantly increases power consumption in the feedback network. This makes such a resolution difficult to achieve and therefore such a data transfer rate impracticable due to operational overhead.

The interleaving feedback network 110 and its related embodiments, however, mitigate these and other issues related to recovering timing data at high data transfer rates. Relative to a conventional feedback network, the feedback network 110 has a feedback device that needs fewer delay cells to achieve a high resolution. For example, for a resolution of UI/15, the first DLL needs as few as 15 delay cells. This is four times less than the 60 delay cells than the conventional DLL-based feedback device. Also, the minimum delay time of individual delay cells can be longer, minimizing power consumption of the first DLL 107. For example, for a data rate of 5 Gbps, an individual delay cell can have a minimum delay time $t_{MIN}$ of about 53 ps, which is four times higher than that of the conventional DLL-based feedback device. Consequently, the delay chains 140, 145 have longer delay times and a fewer number of delay cells. This decreases power consumption in the feedback network 110, making higher feedback signal resolutions possible and higher data transfer rates more attainable.

In other embodiments, a CDR system associated with a specific serial data transfer rate can be produced by designing an interleaving feedback network to have a specific UI and resolution $t_{RES}$. Table 1, for example, shows specific embodiments of designated values of $T_1$, N, and M that can be selected to achieve various values of $t_{RES}$, $t_{MIN}$, and/or UI. Column I shows that $t_{RES}$, $t_{MIN}$, and UI are directly proportional to $T_1$; Column II shows that $t_{RES}$, $t_{MIN}$, and UI are inversely proportional to N; and Column III shows that $t_{RES}$ and $t_{MIN}$ are inversely proportional to M while UI remains fixed.

TABLE 1

Values of $t_{RES}$, $t_{MIN}$, and UI corresponding to designated values of T1, N, and M.

|  | I | | | II | | | III | | |
| --- | --- | --- | --- | --- | --- | --- | --- | --- | --- |
| $t_{RES}$ (ps) | 9 | 13 | 17 | 17 | 13 | 10 | 28 | 13 | 6 |
| $t_{MIN}$ (ps) | 36 | 52 | 68 | 52 | 52 | 52 | 111 | 52 | 25 |
| UI (ps) | 135 | 195 | 255 | 260 | 195 | 156 | 195 | 195 | 195 |
| $T_1$ (ps) | 540 | 780 | 1020 | 780 | 780 | 780 | 780 | 780 | 780 |
| N | 4 | 4 | 4 | 3 | 4 | 5 | 4 | 4 | 4 |
| M ($2^n - 1$) | 15 | 15 | 15 | 15 | 15 | 15 | 7 | 15 | 31 |

From the foregoing, it will be appreciated that specific, representative embodiments of a CDR system have been described herein for purposes of illustration, but that various modifications may be made to these embodiments. For example, more or fewer clock signals, delayed signals, and feedback signals may be produced. Such signals may also have any of a myriad of signal shapes that include various types of rising and falling edge profiles. In addition, certain aspects of the CDR system described in the context of particular embodiments may be combined or eliminated in other embodiments. For example, the first and second multiplexers could be incorporated into the control logic of at least one of the first and second DLLs. Also, other components may be included within the feedback network and/or coupled with the control logic. For example, the control logic could be operably coupled to control a PLL or DLL that generates the clock signals. Moreover, circuits other than the transition multiplexer 150 may be used to ensure the stability of the feedback network when changes are made to the interleaving. Further, while advantages associated with certain embodiments have been described in the context of those embodiments, other embodiments may also exhibit such advantages, and not all embodiments need necessarily exhibit such advantages.

It will also be appreciated that the CDR system and its related embodiments can be incorporated into any of a wide variety of devices operating in a myriad of different operating environments. Embodiments of the device can include a central processing unit, memory, input devices (e.g., keyboard and pointing devices), output devices (e.g., display devices), and storage devices (e.g., disk drives). Embodiments of the operating environment can include personal computers, server computers, handheld or laptop devices, multiprocessor systems, microprocessor-based systems, programmable consumer electronics, digital cameras, network PCs, minicomputers, mainframe computers, distributed computing environments that include any of the above systems or devices, and so on. The computer systems may be cell phones, personal digital assistants, smart phones, personal computers, programmable consumer electronics, digital cameras, and so on. Accordingly, the invention is not limited except as by the appended claims.

From the foregoing, it will be appreciated that specific embodiments of the invention have been described herein for purposes of illustration, but that various modifications may be made without deviating from the spirit and scope of the invention. Accordingly, the invention is not limited except as by the appended claims.

We claim:

1. A system for recovering timing information from a serial data stream, comprising:
   a sampling circuit that produces a recovered data signal by using one or more feedback signals of a plurality of feedback signals to sample a serial data stream; and
   an interleaving feedback network that produces the plurality of feedback signals, comprising:
      a control circuit that produces control signals based on the recovered data signal;
      a first multiplexer that is coupled to receive a plurality of periodic signals and select an individual periodic signal based on a first control signal from the control circuit;
      a first delay-locked loop having a first series of delay cells that produce a plurality of delayed signals based on the selected periodic signal;
      a second multiplexer that is coupled to receive the plurality of delayed signals and selects an individual delayed signal as based on a second control signal from the control circuit; and
      a second delay-locked loop coupled with the second multiplexer and having a second series of delay cells that produces the plurality of feedback signals based on the selected delayed signal, wherein the second delay-locked loop further includes a third multiplexer that is coupled to receive a third control signal from the control circuit, the third multiplexer causing the second delay-locked loop to enter either an open mode of operation or a closed mode of operation in response to the third control signal.

2. The system of claim 1 wherein the first series of delay cells comprises M delay cells, wherein M is a value selected from the series ($2^n-1$) for positive integer values of n.

3. The system of claim 2 wherein the individual periodic signals have a period $T_1$ and have offset phases of unit interval $T_1/N$, wherein N is the number of individual periodic signals received by the first multiplexer.

4. The system of claim 3 wherein the control circuit is configured to control the first and second multiplexers so that the plurality of delayed signals have an incremental resolution of $T_1/(N \times M)$.

5. The system of claim 1, wherein the closed mode of operation is entered when the one of the plurality of periodic signals is selected in response to the first control signal from the control circuit.

6. The system of claim 1, wherein the closed mode of operation is entered when the one of the plurality of delayed signals is selected in response to the second control signal from the control circuit.

7. A method for recovering timing information from a serial data stream, the method comprising:
  selecting one of a plurality of periodic signals based on a data signal associated with a serial data stream that is recovered by a sampling circuit;
  delaying the selected periodic signal to produce a plurality of delayed signals, wherein the plurality of delayed signals are produced by a first delay-locked loop;
  selecting one of the first plurality of delayed signals based on the recovered data signal;
  delaying the selected delay signal to produce a plurality of feedback signals, wherein the plurality of feedback signals are produced by a second delay-locked loop, wherein the second delay-locked loop includes a first multiplexer receiving a control signal from a control circuit;
  using one or more of the plurality of feedback signals as feedback for the sampling circuit that produces the recovered data signal in order to phase-align to transitions in the data stream; and
  placing the second delay-locked loop in either an open mode of operation or a closed mode of operation in response to the control signal received by the first multiplexer from the control circuit.

8. The method of claim 7 wherein each of the plurality of periodic signals corresponds to an individual phase of a global clock signal, and wherein the plurality of periodic signals further comprise N individual periodic signals having a period $T_1$, and being offset from each other by a phase difference of $T_1/N$.

9. The method of claim 8 wherein delaying the selected periodic signal to produce the plurality of delayed signals further comprises producing M individual delayed signals based on one of the N individual periodic signals, wherein the M individual delayed signals are offset from each other by a phase difference of $T_1/M$, and wherein M is a value selected from the series $(2^n-1)$ for positive integer values of n.

10. The method of claim 9 wherein the first delay-locked loop includes a first series of M delay cells, the first series of delay cells producing the plurality of delayed signals.

11. The method of claim 10 wherein selecting the one of the first plurality of delayed signals further comprises controlling the operation of a second multiplexer that couples one of the N individual periodic signals to the first delay-locked loop, and wherein selecting one of the periodic signal phases comprises controlling the operation of a third multiplexer that couples one of the M individual delayed signals to the second delay-locked loop.

12. The method of claim 10 wherein the second delay-locked loop includes a second series of delay cells, the second series of delay cells producing the plurality of feedback signals.

13. The method of claim 7, wherein placing the second delay-locked loop in a closed mode of operation comprises entering the closed mode of operation when selecting the one of the plurality of periodic signals or when selecting the one of the plurality of delayed signals.

14. A serial clock data recovery circuit, comprising:
  a reference clock providing a plurality of clock signals having different phases;
  a first delay-locked loop coupled to the reference clock and generating a plurality of delayed signals from a selected one of the plurality of clock signals;
  a second delay-locked loop coupled to the first delay-locked loop and generating a plurality of feedback signal signals from a selected one of the plurality of delayed signals;
  a sampler array receiving the feedback signal from the second delay-locked loop, wherein the sampler array uses one or more of the plurality of feedback signals to sample an incoming serial bit stream and recover serial data, the sampler array further outputting signals that are used to select the one of the plurality of clock signals and the one of the plurality of delayed signals;
  a control circuit for receiving the signals output from the sampler array and generating a plurality of control signals; and
  a first switch coupled to the second delay-locked loop and the control circuit, the first switch causing the second delay-locked loop to enter either an open mode of operation or a closed mode of operation in response to a first control signal from the control circuit.

15. The serial clock data recovery circuit of claim 14, wherein the first delay-locked loop is comprised of a plurality of delay cells and wherein each of the plurality of delayed signals is generated by a corresponding one of the plurality of delay cells.

16. The serial clock data recovery circuit of claim 14, further comprising a second switch coupled to the reference clock and to the control circuit, the second switch selecting the one of the plurality of clock signals in response to a second control signal from the control circuit.

17. The serial clock data recovery circuit of claim 16, further comprising a third switch coupled to the first delay-locked loop and to the control circuit, the third switch selecting the one of the first plurality of delay signals in response to a third control signal from the control circuit.

18. The serial clock data recovery circuit of claim 14, wherein the closed mode of operation is entered when one of the plurality of clock signals is selected in response to one of the plurality of control signals from the control circuit.

19. The serial clock data recovery circuit of claim 14, wherein the closed mode of operation is entered when one of the first plurality of delay signals is selected in response to one of the plurality of control signals from the control circuit.

20. The serial clock data recovery circuit of claim 14, wherein the closed mode of operation is entered for less than two cycles of the selected one of the plurality of clock signals.

21. The serial clock data recovery circuit of claim 14, wherein the second delay-locked loop is comprised of a plurality of delay cells and wherein the plurality of feedback signals is generated by the plurality of delay cells and provided to the sampler array.

* * * * *